United States Patent [19]

Endo et al.

[11] Patent Number: 4,876,744
[45] Date of Patent: Oct. 24, 1989

[54] MIXER WITH RAT RACE CIRCUIT

[75] Inventors: Kouei Misaizu, Kawasaki; Mitsuo Makimoto, Yokohama; Haruyoshi Endo, Zama, all of Japan

[73] Assignee: Matsushita Electric Industrial Co., Ltd., Osaka, Japan

[21] Appl. No.: 144,156

[22] Filed: Jan. 15, 1988

[30] Foreign Application Priority Data

Jan. 16, 1987 [JP] Japan .................................. 62-8489
Aug. 7, 1987 [JP] Japan ............................... 62-198529

[51] Int. Cl.⁴ .............................................. H04B 1/26
[52] U.S. Cl. .................................. 455/326; 455/327; 455/330
[58] Field of Search ............... 455/323, 325, 326, 327, 455/330, 328; 333/26, 104, 161, 164, 247, 262

[56] References Cited

U.S. PATENT DOCUMENTS

| | | | |
|---|---|---|---|
| 3,629,729 | 12/1971 | Hessler, Jr. | 455/326 |
| 4,032,850 | 6/1977 | Hill | 455/326 |
| 4,035,732 | 7/1977 | Lohrmann | 455/326 |
| 4,468,784 | 8/1984 | Jagnow | 455/326 |
| 4,627,104 | 12/1986 | Knochel | 455/327 |
| 4,755,775 | 7/1988 | Marczewski et al. | 455/327 |

Primary Examiner—Robert L. Griffin
Assistant Examiner—Curtis Kuntz
Attorney, Agent, or Firm—Pollock, VandeSande & Priddy

[57] ABSTRACT

A mixer for outputting an intermediate frequency signal as the result of mixing of a radio frequency signal and a local oscillator signal which are inputted into the mixer. The mixer comprises a balanced-to-unbalanced conversion circuit and a bridge-coupled diode circuit and the balanced-to-unbalanced conversion circuit is constructed of first and second rat race circuits, one being for the radio frequencey signal and comprising a first ring-shaped line and the other being for the local oscillator signal and comprising a second ring-shaped line. The mixer is arranged to include a substrate having first and second pattern-forming surfaces and the first ring-shaped line of the first rat race circuit is formed as a pattern on the first pattern-forming surface of the substrate and the second ring-shaped line of the second rat race circuit is formed as a pattern on the second pattern-forming surface. The bridge-coupled diode circuit is positioned on the first pattern-forming surface thereof and inside the patterned first ring-shaped line.

8 Claims, 2 Drawing Sheets

MIXER WITH RAT RACE CIRCUIT

BACKGROUND OF THE INVENTION

The present invention relates generally to a mixer used in fields of radio communications, measurements and so on, and more particularly to a UHF-SHF mixer for outputting an intermediate frequency signal as a result of mixing of a radio frequency signal and a local oscillator signal inputted thereinto.

Double-balanced type mixers have been developed heretofore and employed for frequency-conversion circuits in high-frequency applications from the viewpoint to many advantageous features such as excellent separation between a local oscillator signal (LO) and a radio frequency signal (RF) and little distortion. The double-balanced type mixer generally comprises a two balanced-to-unbalanced circuits, each of which can be realized by a ferrite core and a winding therearound under the condition that the frequency is below a predetermined value (1GHz), resulting in a small-sized and high-performance mixer. However, in the case of frequencies over the predetermined value, the realization of the balanced-to-unbalanced circuits with the ferrite core and winding becomes impossible because of deterioration of the characteristic of the ferrite. One approach may be to use rat race circuits for realization of the balanced-to-unbalanced circuits in the high-frequency case, the use of a rat race circuit for a mixer being illustrated in U.S Pat. Nos. 4008438 and 4031472. However, the use of the rate race circuits results in complex, high-cost and low-performance arrangement of the mixer.

Furthermore, the isolation terminals of the rat race circuits generally remains in the open-ended state so as not to completely perform the isolation of a high-frequency signal, resulting in unbalance between the rat race circuits and hence in deterioration of the isolation characteristic between the LO input terminal and RF input terminal.

SUMMARY OF THE INVENTION

The present invention has been developed in order to remove the above-mentioned drawbacks inherent to conventional mixers.

It is therefore an object of the present invention to provide a new and improved mixer for outputting an intermediate frequency signal as the result of mixing of a radio frequency signal and a local oscillator signal which are inputted into said mixer which is capable of having a high-performance and allowing simple and low-cost production.

Another object of the present invention is to provide a new and improved mixer which is capable of completely performing isolation of isolation terminals of rat race circuits of the mixer with respect to a radio frequency signal.

With these and other objects which will become apparent as the description proceeds, a mixer according to the present invention includes a balanced-to-unbalanced conversion circuit and a bridge-coupled diode circuit and the balanced-to-unbalanced conversion circuit is made up of first and second rat race circuits, one being for the radio frequency signal and comprising a first ring-shaped line and the other being for the local oscillator signal and comprising a second ring-shaped line. The mixer, in construction, comprises a substrate having first and second pattern-forming surfaces and the first ring-shaped line of the first rat race circuit is formed as a pattern on the first pattern-forming surface of the substrate and the second ring-shaped line of the second rat race circuit is formed as a pattern on the second pattern-forming surface. The bridge-coupled diode circuit is positioned on the first pattern-forming surface thereof and inside the patterned first ring-shaped line.

In accordance with the present invention, there is further provided a mixer including a balanced-to-unbalanced conversion circuit for outputting an intermediate frequency signal as the result of mixing of a radio frequency signal and a local oscillator signal which are inputted into the mixer. The balanced-to-unbalanced conversion circuit is made up of first and second rat race circuits, one being for the radio frequency signal and comprising a first ring-shaped line and the other being for the local oscillator signal and comprising a second ring-shaped line. A feature of this mixer is that an isolation terminal of each of the first and second rat race circuits is coupled through a resistor to a stub member to isolate the isolation terminal with respect to the radio frequency signal.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
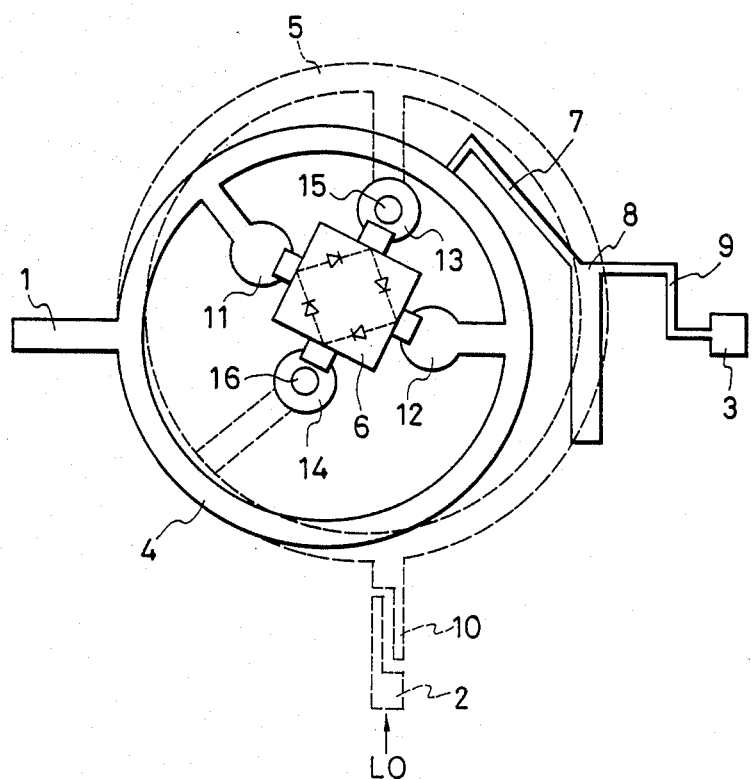
FIG. 1 is a diagram showing a mixer according to a first embodiment of the present invention.
Figure 2:
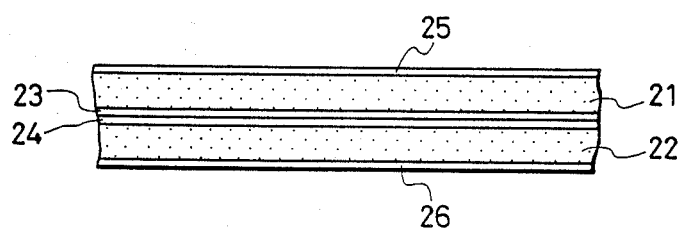
FIG. 2 is a cross-sectional view showing a substrate on which rat race circuits used as a balanced-to-unbalanced conversion circuit of the FIG. 1 mixer are formed as patterns.
Figure 3:
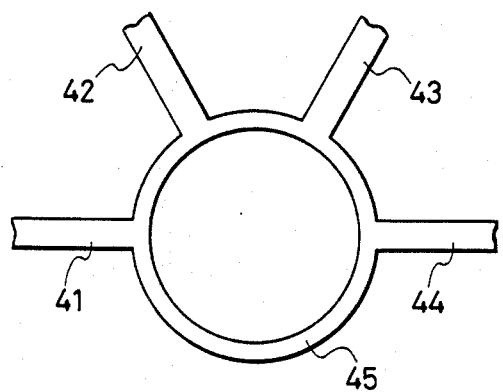
FIG. 3 is an illustration for describing a rat race circuit functioning as a balun.

Referring now to FIGS. 1 and 2, there is illustrated a mixer according to an embodiment of the present invention which comprises two rat race circuits, one being arranged as an RF balun and the other being arranged as LO balun. Generally, a rat race circuit, as shown in FIG. 3, comprises a ring-shaped line 45 having a diameter of 6/4 λg where λg represents the wavelength of a radio frequency signal (RF) and four output ports 41 to 44 arranged at intervals of λg/4. In response to excitation of the port 41, the outputs with the same level can be produced with a delay of 90° at the port 42 and with a delay of 270° at the port 44, and no output is produced at the port 43 (isolation port). Here, the phase difference between the port 42 and 44 is 180°, and therefore, the use of the port 41 as an unbalance input and the use of the ports 42 and 44 as two balance outputs allows realization of a balun.

In FIG. 1, the RF and LO rat race circuits include ring-shaped lines 4, 5, the RF ring-shaped line 4 being coupled to an RF input terminal 1 and through lines 7, 8, 9, making up a low pass filter (LPF), to an IF (intermediate frequency) terminal 3 and the LO ring-shaped line 5 being coupled through a DC cut portion 10 to a LO input terminal 2. A bridge type diode quad 6 constructed of four diodes for mixing of the RF and LO signals and for generating a signal with a frequency which is different between frequencies of a radio frequency signal (RF) and a local oscillator signal (LO) is provided in the RF ring-shaped line 4 and coupled to balance output terminals 11, 12 of the RF rat race circuit. Here, because the arrangement of a mixer including a bridge type diode quad and a low pass filter is known, a detailed description therefor will be omitted for brevity. On the other hand, balance output terminals 13, 14 of the LO rat race circuit are coupled through through-holes 15, 16, which will be described hereinafter, to the bridge type diode quad 6. The above-described circuits are formed on both surfaces of a substrate, as shown in FIG. 2, comprising dielectric portions 21, 22 made of a dielectric material, conductor portions 23, 24 provided between the dielectric portions 21, 22 and grounded, and pattern-forming portions 25, 26 provided symmetrically on the dielectric portions 21,22. The rat race circuits may be formed thereon by means of the etching techniques. In this embodiment, the RF rat race circuit including at least the RF ring-shaped line 4 is formed as a pattern (strip line) on the pattern-forming portion 25 and LO rat race circuit including at least the LO ring-shaped line 5 is formed as a pattern (strip line) on another pattern-forming portion 26. The diode quad 6 is arranged on the RF side pattern-forming portion 25 so as to be placed inside the RF ring-shaped line 4 formed as a pattern. The substrate has at least the through-holes 15, 16 formed in the directions substantially normal to the surfaces thereof so that the balance output terminals 13, 14 of the LO rat race circuit can be coupled to the diode quad 6. The symmetrical formation of the RF and LO rat race circuits on both the surfaces of the substrate results in the fact that the connection between the RF and LO rat race circuits can be made with the minimum distances and in a double balanced mixer with high performance. Furthermore, the arrangement of the diode quad 6 inside the RF ring-shaped line 4 causes allowance of size-reduction of the mixer.

Figure 4:
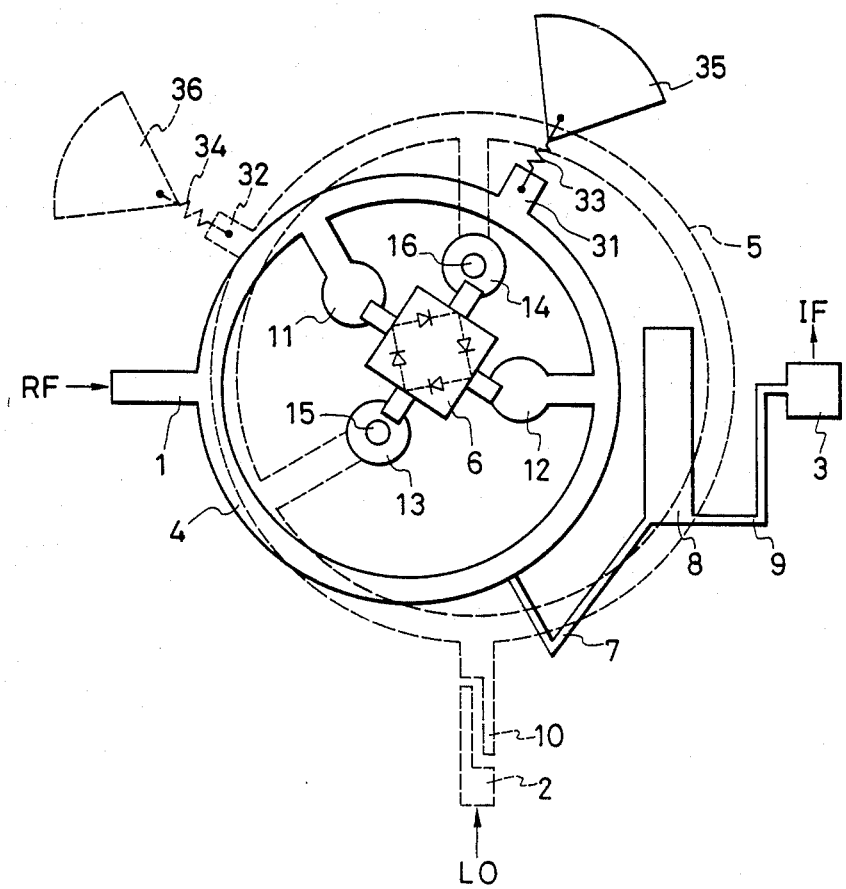
FIG. 4 is a diagram showing a mixer according to a second embodiment of the present invention.

FIG. 4 shows a mixer according to another preferred embodiment of the present invention in which parts corresponding to those in FIG. 1 are marked with the same numerals and the descriptions thereof are omitted for simplicity. One difference between the mixer of FIG. 4 and the first-mentioned mixer of FIG. 1 is that isolation terminals 31, 32 of the RF and LO rat race circuits, as illustrated in the same diagram, are coupled through resistors 33, 34 of 50Ω to short-stubs 35, 36, respectively. This arrangement allows complete isolation of a high-frequency signal, resulting in prevention of deterioration of isolation characteristic between the RF and LO input terminals 1 and 2.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention. For example, although in the above description the substrate for forming the RF and LO rat race circuit patterns thereon is constructed of two layers each having a pattern-forming surface, a conductor surface, and a dielectric portion provided therebetween, it is also appropriate that the substrate is formed to have more-than-two layers.

What is claimed is:

1. A mixer including a balanced-to-unbalanced conversion circuit and a bridge-coupled diode circuit, coupled to said balanced-to-unbalanced conversion circuit, for outputting an intermediate frequency signal as the result of mixing of a radio frequency signal and a local oscillator signal which are inputted into said mixer, said balanced-to-unbalanced conversion circuit being constructed of first and second rat race circuits, one being for said radio frequency signal and comprising a first ring-shaped conductive line and the other being for said local oscillator signal and comprising a second ring-shaped conductive line, said mixer comprising substrate means having first and second surfaces, said first ring-shaped conductive line of said first rat race circuit being formed as a pattern on said first surface of said substrate and said second ring-shaped conductive line of said second rat race circuit being formed as a pattern on said second surface, said bridge-coupled diode circuit comprising four diodes so as to mix said radio frequency signal and said local oscillator signal to produce a signal with a frequency between frequencies of the radio frequency signal and said local oscillator signal and being positioned within said first ring-shaped line on said first surface thereof.

2. A mixer as claimed in claim 1, wherein said substrate has a conductor portion which is disposed between said first and second surfaces thereof and which is grounded.

3. A mixer as claimed in claim 1, wherein said substrate has at least two through-holes so that said first and second rat race circuits are coupled to each other by way of coupling means.

4. A mixer including a balanced-to-unbalanced conversion circuit for outputting an intermediate frequency signal as the result of mixing of a radio frequency signal and a local oscillator signal which are inputted into said mixer, said balanced-to-unbalanced conversion circuit being constructed of first and second rat race circuits, one being for said radio frequency signal and comprising a first ring-shaped line and the other being for said local oscillator signal and comprising a second ring-shaped line, each of said first and second rat race circuits having an isolation terminal which is placed at a predetermined angular position with respect to an input terminal thereof for said radio frequency signal or said local oscillator signal which is coupled through a resistor to a stub member to isolate the inputted radio frequency signal or the inputted local oscillator signal with respect to the radio frequency signal.

5. A mixer as claimed in claim 4, wherein said resistor has a value of 50Ω.

6. A mixer as claimed in claim 4, further including a bridge-coupled diode circuit and wherein said bridge-coupled diode circuit is positioned inside of said first ring-shaped line.

7. A mixer as claimed in claim 6, further including a substrate having first and second surfaces, and wherein said first ring-shaped line is formed as a pattern on said first surface and said second ringshaped line is formed as a pattern on said second surface.

8. A mixer as claimed in claim 7, wherein said substrate has a conductor portion positioned between said first and second pattern-forming surfaces, said conductor portion being grounded.

* * * * *

UNITED STATES PATENT AND TRADEMARK OFFICE
CERTIFICATE OF CORRECTION

PATENT NO. : 4,876,744

DATED : October 24, 1989

INVENTOR(S) : Kouei Misaizu, et al.

It is certified that error appears in the above-identified patent and that said Letters Patent is hereby corrected as shown below:

In the heading, under "United States Patent [19]", change "Endo et al." to --Misaizu et al.--.

Signed and Sealed this

Sixteenth Day of October, 1990

Attest:

HARRY F. MANBECK, JR.

*Attesting Officer*      *Commissioner of Patents and Trademarks*